United States Patent [19]
Smith

[11] 3,987,402
[45] Oct. 19, 1976

[54] MULTI-CHANNEL GAIN CONTROLS

[76] Inventor: Russell Peter Smith, 21 Muritai Terrace, Christchurch, New Zealand

[22] Filed: Jan. 15, 1975

[21] Appl. No.: 541,145

[30] Foreign Application Priority Data
Jan. 18, 1974 New Zealand .................... 173129

[52] U.S. Cl. .............................. 340/1 R; 325/397; 343/7 AG
[51] Int. Cl.² ........................................ H04B 1/16
[58] Field of Search .......... 325/306, 307, 348, 397, 325/398, 401, 407; 340/3 FM, 1 R; 343/5.5 M, 7 AG

[56] References Cited
UNITED STATES PATENTS

| | | | |
|---|---|---|---|
| 2,754,492 | 7/1956 | Parker | 340/3 FM X |
| 2,959,674 | 11/1960 | O'Meara | 325/401 |
| 2,984,741 | 5/1961 | Bronstein et al. | 325/307 |
| 3,366,922 | 1/1968 | Kay | 340/1 R |

*Primary Examiner*—Richard A. Farley
*Attorney, Agent, or Firm*—Holman & Stern

[57] ABSTRACT

A gain control and method therefor which allows the use of a single gang variable attenuator for the synchronous control of the gains of each channel of a multi-channel system of the type employing a separate transmission path for each channel. This is accomplished by inserting multipliers at the output of each transmission path and multiplying the path signals with a carrier signal the level of which is varied with a single gang attenuator. The level of the multiplier output signals vary in accordance with the level of the carrier signal. Where intelligence signals are to be inserted at the input of each transmission path these are multiplied with the carrier signal prior to insertion resulting in the recovery of the intelligence signal at the output of the multipliers located at the output of each path. An increased range of gain control can be achieved by inserting the attenuated carrier signal at the inputs of each transmission path.

13 Claims, 3 Drawing Figures

MULTI-CHANNEL GAIN CONTROLS

BACKGROUND OF THE INVENTION

This invention relates to multi-channel gain controls and methods of controlling the gain in a multi-channel system. An example of an application of the invention is as a gain control in radar or sonar systems having more than one receiving channel.

The simplest form of a multi-channel gain control comprises a number of variable attenuators having substantially identical characteristics which are mechanically ganged. To achieve with certainty tracking errors (i.e., gain differences) less than 5% over even a limited dynamic range of gain, it is necessary to use "high precision" controls. Such controls are expensive and bulky. Furthermore, as the maximum attenuation possible is limited by the stray coupling between the attenuator input and output circuits it may be necessary to carry out the attenuation in two or more isolated stages to achieve an adequate dynamic range of gain. When multi-channel attenuation is required with very low tracking errors a wide range of attenuation can only be achieved at great cost and complexity.

An application of a precise multi-channel gain control is in radar or sonar systems having two or more receiving channels to provide source direction information. In such systems it is essential to be able to vary the gains of each channel in precise synchronism, as unequal channel gains will produce directional errors. An example of a sonar system of this type is that described in U.S. Pat. No. 3,366,922 which relates in particular to a binaural sensory aid for blind persons. Two receiving channels are used in these aids and the use of conventional precision ganged attenuators is not compatible with the special packaging requirements.

SUMMARY OF THE INVENTION

It is therefore an object of the present invention to provide a method of controlling the gain of a multi-channel system. It is a further object of the present invention to provide a multi-channel gain control which will go some way towards overcoming the above-mentioned disadvantages. Accordingly in one aspect the invention consists in a method of controlling the gain in a multi-channel system employing a separate transmission path for each channel. A carrier signal is generated and multiplied with the intelligence signal associated with each transmission path. Unwanted low frequencies from each product signal are filtered out and each filtered signal is passed through an associated transmission path. The same carrier signal is also controllably attenuated and the attenuated signal is multiplied with each transmission path output signal. Unwanted high frequencies from these product signals are filtered out. The amplitudes of the intelligence signals resulting after filtering are each determined by the degree of attenuation of the carrier signal.

In a further aspect, the invention consists in a method of synchronously controlling the gain in a multi-channel transmitter-receiver system employing a separate transmission path for each channel. A carrier signal is generated and applied to said transmission paths. This carrier signal is also controllably attenuated and the attenuated signal is multiplied with each transmission path output signal. The unwanted high frequencies from the multiplication product signals are then filtered out. The amplitudes of the signals remaining after filtering are each determined by the degree of attenuation of the carrier signal.

In yet a further aspect the invention consists in a multi-channel gain control for controlling the gain in a system employing a separate transmission path for each channel. A carrier signal oscillator is provided together with a plurality of intelligence signal inputs each associated with a transmission path. First multipliers each feeding a transmission path receive as inputs a respective intelligence signal and the carrier signal from said oscillator, high pass filter means being interposed between the multipliers and the transmission paths to filter out unwanted components of the multiplier outputs. The carrier signal from the oscillator also is taken to a variable attenuator. A plurality of second multipliers each receive as one input the signal from a respective transmission path and as another input the attenuated carrier signal from the attenuator. Low pass filter means follow each second multiplier to filter out unwanted components from the multiplier outputs. The amplitudes of the intelligence signals resulting at the output of the filters are determined by the setting of the attenuator.

In yet a further aspect the invention consists in a gain control for synchronously controlling the gain in a multi-channel transmitter-receiver system employing a separate transmission path for each channel. A carrier signal oscillator is provided and oscillator output means feed the carrier signal to said transmission paths. The output of said oscillator is also applied to a variable attenuator which feeds multipliers corresponding to each transmission path within which the signal from the attenuator is multiplied with the signal received from the respective transmission path. Low-pass filter means filter out unwanted components of the multiplier product signals. The amplitude of the signals at the output of each filter are determined by the setting of the attenuator.

BRIEF DESCRIPTION OF THE DRAWINGS

The preferred forms of the invention will now be described with reference to the accompanying drawings, in which.

DETAILED DESCRIPTION OF THE PREFERRED EMBODIMENTS

The essential feature of the present invention is that the gains in each channel of a multi-channel system may be varied together precisely in synchronism by the use of a single variable attenuator.

Figure 1:
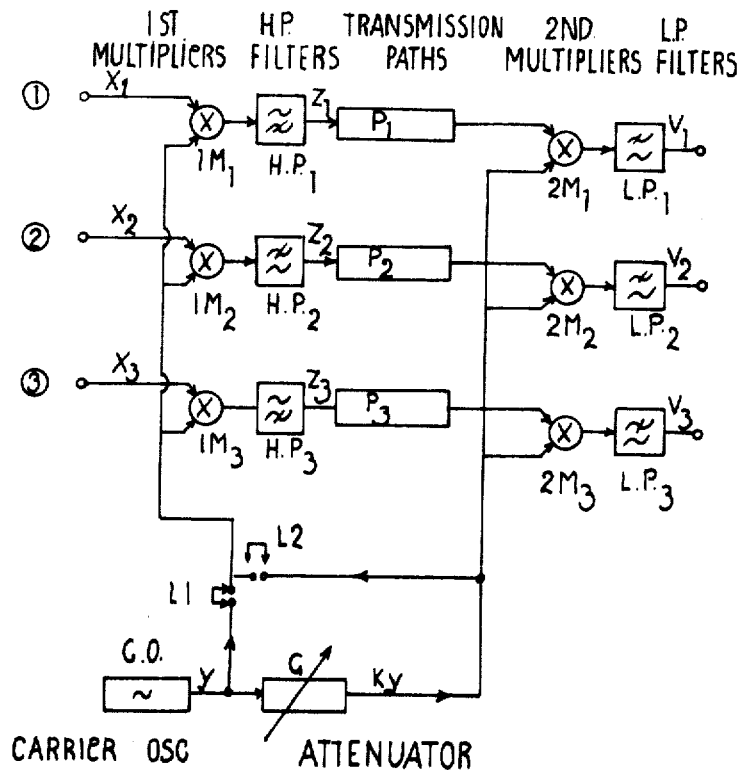
FIG. 1 is a block circuit diagram of a multi-channel gain control, including the modification necessary to achieve greater attenuation.

Referring to FIG. 1, three channels of a multi-channel system are shown where the respective input intelligence signals are $x_1$, $x_2$ and $x_3$, and the corresponding output signals are $v_1$, $v_2$, and $v_3$. Each channel input signal feeds one of a first set or bank of multipliers $1M_1$, $1M_2$, and $1M_3$. A carrier oscillator C.O. generates a carrier signal $y$ which feeds each of the first multipliers. The output of each multiplier, which may be considered to be the carrier signal $y$ modulated by each intelligence signal $x_i$ (where $i$ is the channel number) is fed to a high pass filter $H.P._i$ to remove any residual input signal due to imperfect multiplication. The outputs $z_i$ of the high pass filters feed transmission paths $P_i$ which could vary in nature from a simple connecting lead to an electromagnetic or acoustic transmission medium. The received signal from each transmission path is fed to one of a second bank of multipliers $2M_i$. The carrier signal $y$, as well as feeding the first multipliers, is taken to a variable attenuator G, and the attenuated output signal K.y feeds each of the second multipliers. The product of the attenuated carrier signal K.y with each received signal is fed to a low pass filter $L.P._i$, which removes signal components having frequencies greater than the frequencies of the input signals $x_i$. The resultant output signals $v_i$ are replicas of the input signals $x_i$ diminished by the attenuation factor K. Hence, a variation of the variable attenuator G effects all channels equally.

That the above result is obtained is demonstrated by the following analysis.

Assuming both signal and carrier waveforms are sinusoidal the signal and carrier may be represented respectively as:

$x_i = X_i \sin w_i t$ and $y = Y \cos w_y t$ where $w_i$ = the angular frequency of the input signal
$w_y$ = the angular frequency of the carrier signal
$X_i$ = the amplitude of the input signal
$Y$ = the amplitude of the carrier signal The output of the first multipliers $1M_i$ will be:

$X_i Y \sin w_i t + S$ or $X_i Y/2 \{\sin(w_i + w_y)t + \sin(w_i - w_y)t\} + S$ where S represents signals produced by imperfect operation of the multipliers.

Imperfect operation of the multipliers will allow some of the original signals $x_i$ and some of the carrier signal $y$ to appear at the output of each multiplier. High pass filtering will completely eliminate the residual $x_i$ feedthrough if the carrier frequency is chosen appropriately but will allow a residual carrier signal Cy to pass.

The high pass filter output $Z_i$ is then:

$X_i Y/2 \{\sin(w_i + w_y)t + \sin(w_i - w_y)t\} + Cy$

Any modification by the transmission path can be ignored since this is irrelevant to the operation of the system. The second multiplier output, $z_i K y$ is:

$X_i K Y^2/4 \{\sin(w_i + 2w_y)t + \sin w_i t + \sin w_i t + (w_i - 2w_y)t\} + CKY^2 (\cos 2w_y t + 1) + S'$.

Again, due to multiplier limitations, some of $z_i$ and $y$ will also appear at the output. These unwanted outputs are accounted for in the term S'. However, providing the carrier signal has been chosen to be greater than twice the frequency of $x_i$ the only terms which appear at the output of the LP filters are:

$$v_i = \frac{X_i K Y^2}{2} \sin W_i t + \frac{CKY^2}{2}$$

The second term is a small spurious DC term which may be minimised by optimum adjustment of the first multiplier and in many applications is irrelevant.

The useful output term is:

$v_i = \frac{1}{2} X_i K Y^2 \sin w_i t$
$= K/2\ Y^2 x_i$
$v_1 = K/2\ Y^2 x_1$
$v_2 = K/2\ Y^2 x_2$
$v_3 = K/2\ Y^2 x_3$ That is, the amplitudes of signal outputs of all channels vary directly with K.

With the above method of gain control tracking between channels to within 0.1 dB over a dynamic range of 60 dB can be achieved without difficulty.

Figure 3:
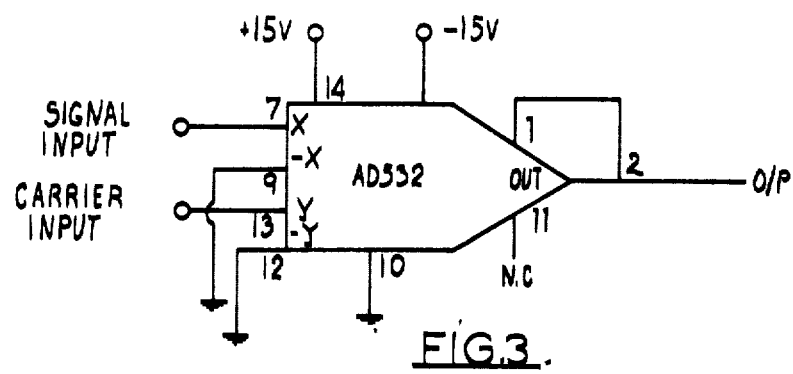
FIG. 3 is an example of a multiplier suitable for use in the multi-channel gain controls of FIGS. 1 and 2.

Various known multipliers, filters, oscillators and variable attenuators may be used in a realisation of the block circuit shown in FIG. 1. However, as an example, a typical multiplier circuit is shown in FIG. 3. The AD 532 multiplier used is an integrated circuit of the 14 pin package type produced by Analogue Devices Incorporated. The variable attenuator may be a precision step switched type, or a simple variable resistance type, depending on the application. Similarly, the characteristics of the high and low pass filters will vary according to the application.

In a second form of the invention a considerably greater range of attenuation is provided by applying the attenuated carrier signal Ky to each multiplier of the first bank of multipliers. This modification is illustrated diagramatically in FIG. 1 where link L1 would be removed and link L2 inserted. In this case, the carrier signal feeding the first multipliers also reduces as K reduces. The output signals of this form of the invention may be represented as:

$V_i = K^2/2\ Y^2 x_i$

Thus, the outputs now all vary directly with $K^2$. In this second form of the invention the dynamic range over which the gain may be varied is greatly increased due to the effective provision of two separate stages of attenuation, each having the same range as the single stage of the first form of the invention. As previously mentioned, the range of attenuation is limited by the stray coupling between the input and the output of the attenuator or direct coupling of the signal source into the output circuit. This two-stage attenuation approach as well as providing a theoretically greater range of attenuation, reduces coupling between the input and output by use of two isolated stages of attenuation. In terms of decibels the second form of the invention provides twice the attenuation of the first form.

A further form of the invention will now be described with reference to a particular application.

In certain types of sonar and radar systems a transmitted signal is frequently used in conjunction with two or more receivers to derive directional information of a source of transmitted signal reflection. The direction information may be given by differences in the relative levels of the received signals. For example in the binaural sensory aid described in U.S. Pat. Nos. 3,366,922 the transmitted signal is frequency swept and accordingly the received echo along two different paths will show a difference in frequency with respect to the transmitted signal at any one instant. The received signals are therefore each multiplied with the transmitted carrier to produce audible signals having frequencies equal to the difference between the received frequency of each echo and the transmitted signal frequency. The beat frequencies are indicative of the distance between each receiver and the source of reflection.

The transmitting and receiving transducers have directional characteristics such that directions information on the source of reflection is supplied by the differing relative levels of the two received signals. In such a system it is essential to be able to control the gains of the receiver channels in precise synchronism since differing channel gains will lead to errors in the derived direction information.

Figure 2:
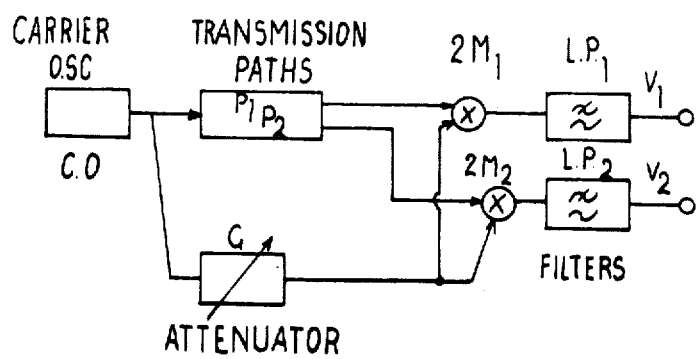
FIG. 2 is a block circuit diagram of a two-channel gain control suitable for use in radar or sonar.

Since the sensory aid uses two acoustic/electric receiving transducers mounted with a single electric/acoustic transmitting transducer the system is a two channel one, each transmission path comprising the air path from the transmitting device to a reflecting object and the return air path to a respective receiving device. The useful information derived from each receiving device is the time taken for the acoustic signal to traverse each transmission path and the angle each path makes with the receiving transducers. Because the "intelligence" information in this system is inherently produced by the transmission paths the carrier signal feeds both transmission paths without prior multiplication with external intelligence signals. As will be appreciated from FIGS. 1 and 2 and associated description of U.S. Pat. No. 3,172,075 which describes the electronics used in the aid of U.S. Pat. No. 3,366,922, the transmission path reflection time information is made available by frequency sweeping the transmitted carrier signal and multiplying this frequency swept signal with the received and delayed reflections of the transmitted signal. Accordingly the gain control described with reference to FIG. 1 of the present specification takes the configuration shown in FIG. 2 when used to control the amplitudes of the output signals of the two channel blind aid system. This can be compared with FIG. 1 of U.S. Pat. No. 3,172,075 and it will be seen that the modification permitting synchronous gain control of both receiving units is the provision of attenuator G in the carrier signal feeds to the multipliers (labelled frequency changes 19 in the U.S. Patent). The level of the audible signal from both multipliers thus varies in accordance with the attenuation factor K of attenuator G.

The input signal to the transmission paths would be obtained from an electric/acoustic transducer and the output signals of said paths would be applied to electric/acoustic transducers.

Again, in correspondence with the first form of the invention, to enable an increased range of gain control the signal feeding the transmission paths can be that at the output of the attenuator.

I claim:

1. A method of controlling the gain in a multi-channel system employing a separate transmission path for each channel comprising:
   generating a carrier signal,
   multiplying each of a plurality of intelligence signals each associated with a transmission path with said carrier signal to produce first product signals,
   filtering unwanted low frequencies from each first product signal, passing each filtered signal through an associated transmission path,
   controllably attenuating said carrier signal,
   multiplying the signal from each transmission path with the attenuated carrier signal to produce second product signals,
   filtering unwanted high frequencies from each second product signal, the amplitudes of the intelligence signals resulting after filtering each being determined by the degree of attenuation of the carrier signal.

2. A method according to claim 1, wherein the carrier signal multiplied with the intelligence signal is said attenuated carrier signal.

3. A method of synchronously controlling the gain in a multi-channel transmitter-receiver system employing a separate transmission path for each channel comprising:
   generating a carrier signal,
   controllably attenuating said carrier signal,
   applying the attenuated carrier signal to the inputs of said transmission paths,
   multiplying the signal from the output of each transmission path with the attenuated carrier signal, and filtering out unwanted low frequencies from the multiplication product signals,
   the amplitudes of the signals remaining after filtering each being determined by the degree of attenuation of the carrier signal.

4. A multi-channel gain control for controlling the gain in a system employing a separate transmission path for each channel comprising:
   a carrier signal oscillator,
   a plurality of intelligence signal inputs each associated with a transmission path,
   a plurality of first multipliers each feeding a transmission path and each receiving as inputs an intelligence signal and the carrier signal from said oscillator,
   high pass filter means interposed between said multipliers and said transmission paths to filter out unwanted components of the multiplier outputs,
   a variable attenuator to which the output of said oscillator is applied,
   a plurality of second multipliers each receiving as one input the signal from a transmission path and as another input the attenuated carrier signal from said attenuator, and low pass filter means following each second multiplier to filter out unwanted components from the multiplier output,
   the amplitudes of the intelligence signals resulting at the output of the filters each being determined by the setting of said attenuator.

5. A multi-channel gain control according to claim 4 wherein the carrier signal input to the first multipliers is taken from the output of said attenuator.

6. A multi-channel gain control according to claim 4 wherein each transmission path is an electrical conductor.

7. A multi-channel gain control according to claim 5 wherein each transmission path is an electrical conductor.

8. A multi-channel gain control according to claim 4 wherein the carrier signal oscillator frequency is greater than twice the intelligence signal frequency.

9. A gain control for synchronously controlling the gain in a multi-channel transmitter-receiver system employing a separate transmission path for each channel comprising:
   a carrier signal oscillator,
   a variable attenuator to which the output of said oscillator is applied,
   oscillator output means feeding the attenuated carrier signal to the inputs of said transmission paths,
   a plurality of multipliers each corresponding to a transmission path within which each signal received from the output of a respective transmission path is multiplied with the attenuated carrier signal, and low pass filter means to filter out unwanted components of the product signals, the amplitudes of the signals at the output of the filters each being determined by the setting of said attenuator.

10. A gain control according to claim 9 wherein the number of channels controlled is two.

11. A gain control according to claim 10 wherein the carrier signal oscillator frequency is in the ultrasonic range.

12. A gain control according to claim 11 wherein the transmission paths are acoustic media, the oscillator output means is an electric/acoustic transducer, and an electric/acoustic transducer is associated with and feeds each multiplier.

13. A gain control according to claim 12 wherein the transmission path transmitter and receiver terminals are located together.

* * * * *